(12) United States Patent
Uno et al.

(10) Patent No.: US 8,947,166 B2
(45) Date of Patent: Feb. 3, 2015

(54) RADIO FREQUENCY POWER AMPLIFIER

(75) Inventors: Takashi Uno, Hyogo (JP); Hikaru Ikeda, Osaka (JP); Kazuhiro Yahata, Osaka (JP); Motoyoshi Iwata, Osaka (JP); Hiroshi Naitou, Osaka (JP); Tomohide Kamiyama, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 61 days.

(21) Appl. No.: 13/824,425

(22) PCT Filed: May 22, 2012

(86) PCT No.: PCT/JP2012/003321
§ 371 (c)(1),
(2), (4) Date: Mar. 18, 2013

(87) PCT Pub. No.: WO2013/001711
PCT Pub. Date: Jan. 3, 2013

(65) Prior Publication Data
US 2013/0176079 A1    Jul. 11, 2013

(30) Foreign Application Priority Data

Jun. 28, 2011 (JP) .................................. 2011-143592

(51) Int. Cl.
*H03F 3/191* (2006.01)
*H03F 3/193* (2006.01)
(Continued)

(52) U.S. Cl.
CPC .............. *H03F 3/193* (2013.01); *H03F 1/0205* (2013.01); *H03F 1/565* (2013.01); *H03F 3/601* (2013.01); *H03F 2200/387* (2013.01); *H03F 2200/423* (2013.01)
USPC ........................................................ 330/302

(58) Field of Classification Search
CPC . H03F 3/1935; H03F 3/193; H03F 2200/372; H03F 3/345; H03F 3/601; H03F 3/191; H03F 1/56; H03F 1/565; H03F 2200/222
USPC .................................. 330/277, 302, 305, 306
See application file for complete search history.

(56) References Cited

U.S. PATENT DOCUMENTS 5,352,990 A    10/1994  Goto
6,177,841 B1    1/2001  Ohta et al.
(Continued)

FOREIGN PATENT DOCUMENTS

JP    62-000111    1/1987
JP    05-191174    7/1993
(Continued)

OTHER PUBLICATIONS

International Search Report issued Aug. 7, 2012 in International (PCT) Application No. PCT/JP2012/003321.

*Primary Examiner* — Khanh V Nguyen
(74) *Attorney, Agent, or Firm* — Wenderoth, Lind & Ponack, L.L.P.

(57) ABSTRACT

A radio frequency power amplifier includes: an amplifying element which amplifies an input signal and outputs the signal from an output terminal; and an output load circuit which includes a first resonant circuit and a second resonant circuit that are connected to the output terminal. The first resonant circuit has a resonance frequency higher than the frequency of the second harmonic of the input signal, and the second resonant circuit has a resonance frequency lower than the frequency of the third harmonic of the input signal. The output load circuit has such an impedance looking from the output terminal that a phase of a reflection coefficient at the second harmonic of the input signal is greater than 180 degrees and less than 360 degrees, and a phase of a reflection coefficient at the third harmonic of the input signal is greater than 0 degrees and less than 180 degrees.

11 Claims, 6 Drawing Sheets

(51) Int. Cl.
*H03F 1/02* (2006.01)
*H03F 1/56* (2006.01)
*H03F 3/60* (2006.01)

(56) References Cited

U.S. PATENT DOCUMENTS

| | | | |
|---|---|---|---|
| 6,396,348 B1 | 5/2002 | Honjo | |
| 8,154,348 B2 | 4/2012 | Honjo et al. | |
| 8,350,627 B2 * | 1/2013 | Hellberg | 330/302 |
| 2002/0067212 A1 * | 6/2002 | Takenaka | 330/302 |
| 2009/0039962 A1 | 2/2009 | Uno et al. | |
| 2011/0050350 A1 | 3/2011 | Honjo et al. | |

FOREIGN PATENT DOCUMENTS

| | | |
|---|---|---|
| JP | 06-204764 | 7/1994 |
| JP | 08-148949 | 6/1996 |
| JP | 2000-106510 | 4/2000 |
| JP | 2001-111362 | 4/2001 |
| JP | 2005-117200 | 4/2005 |
| JP | 2008-113402 | 5/2008 |
| JP | 2008-263439 | 10/2008 |
| JP | 2009-065637 | 3/2009 |
| JP | 2009-130472 | 6/2009 |
| JP | 2011-055152 | 3/2011 |

* cited by examiner

Signal frequency : 1 GHz

FIG. 2B

Signal frequency : 2.45 GHz

(a) Relationship between PAE and phase of reflection coefficient at second harmonic (b) Relationship between PAE and reflection coefficient at third harmonic

RADIO FREQUENCY POWER AMPLIFIER

TECHNICAL FIELD

The present invention relates to radio frequency power amplifiers, and in particular, to a radio frequency power amplifier suitable for use as a class F amplifier circuit or an inverse class F amplifier circuit which controls harmonics.

BACKGROUND ART

A radio frequency power amplifier has such input and output characteristics that (i) when input power is low, a signal is amplified while maintaining constant gain in a linear region, and (ii) as the input power increases and gain begins to decrease, output power becomes constant in a saturation region regardless of the input power level.

For example, a Doherty amplifier is known as a representative technique for increasing the power added efficiency (PAE) in the linear region. Furthermore, for example, a class F amplifier is known as a technique for increasing the PAE in the saturation region.

A class F amplifier using a field effect transistor (FET) makes the temporal waveform of the voltage of the drain terminal of the FET closer to a square wave, and decreases the area of the overlapping portion of the temporal waveform of the drain terminal voltage and the temporal waveform of the drain terminal current, by short circuiting the load at an even harmonic as seen from the drain terminal of the FET and opening the load at an odd harmonic as seen from the drain terminal (referred to as class F load conditions). Consequently, the power consumed by the FET decreases, resulting in extremely high PAE (for example, see Patent Literature (PTL) 1).

However, in practice, even if a class F load circuit, which short circuits the load at an even harmonic and opens the load at an odd harmonic, is provided at the output side of the FET, influences of parasitic components of the FET hinder high-efficiency operation. A FET has parasitic capacitance between the drain and the source, which influences the temporal waveforms of the voltage and current of the drain terminal. Hence, a class F load circuit needs to be designed considering the parasitic capacitance between the drain and the source (For example, see PTL 2).

CITATION LIST

Patent Literature

[PTL 1] Japanese Unexamined Patent Application Publication No. 6-204764
[PTL 2] Japanese Unexamined Patent Application Publication No. 2008-263439

SUMMARY OF INVENTION

Technical Problem

However, considering the parasitic capacitance between the drain and the source for a high-power radio frequency power amplifier is insufficient to achieve high PAE.

The present invention has an object to provide a radio frequency power amplifier which is capable of achieving high output power and high PRE.

Solution to Problem

In order to achieve the object, an aspect of the radio frequency power amplifier according to the present invention is a radio frequency power amplifier which performs class F operation. The radio frequency power amplifier includes an amplifying element which amplifies an input signal and outputs the amplified input signal from an output terminal; and an output load circuit which includes a first resonant circuit and a second resonant circuit that are connected to the output terminal. The first resonant circuit has a resonance frequency higher than a frequency of a second harmonic of the input signal, and the second resonant circuit has a resonance frequency lower than a frequency of a third harmonic of the input signal. With reference to an output impedance of the amplifying element, the output load circuit has such an impedance looking into the output load circuit from the output terminal that a phase of a reflection coefficient at the second harmonic of the input signal is greater than 180 degrees and less than 360 degrees, and a phase of a reflection coefficient at the third harmonic of the input signal is greater than 0 degrees and less than 180 degrees.

Advantageous Effects of Invention

A radio frequency power amplifier according to the present invention adjusts the phase of the reflection coefficient at the second harmonic to be capacitive (greater than 180 degrees and less than 360 degrees), and adjusts the phase of the reflection coefficient at the third harmonic to be inductive (greater than 0 degrees and less than 180 degrees), in an output load circuit as seen from the output terminal of an amplifying element. Consequently, also in a case where a high-power amplifying element is used as an amplifying element, the load as seen from the drain terminal meets the class F load conditions considering the influences of the parasitic capacitance and parasitic inductance of the amplifying element, leading to high PAE.

BRIEF DESCRIPTION OF DRAWINGS

[FIG. 1A]
[FIG. 1B]
[FIG. 2A]
[FIG. 2B]
[FIG. 3A]
[FIG. 4]
[FIG. 5A]
[FIG. 5B]

[FIG. 6]
[FIG. 7A]
[FIG. 7B]

DESCRIPTION OF EMBODIMENTS (Knowledge of the Inventors)

In the technique according to PTL 2, a load circuit of a radio frequency power amplifying circuit is designed considering parasitic capacitance between the drain and the source of a FET serving as an amplifying element, to increase PAE of the radio frequency power amplifying circuit.

However, the inventors have found out in their studies that consideration of only the parasitic capacitance between the drain and the source is insufficient for a high-power radio frequency power amplifier. To achieve high-power operation, the FET needs to drive a large amount of current. This requires the size of the FET (gate width) to significantly increase. The increase in the size of the FET decreases the impedance of the FET. The inventors have found out that sufficient increase in efficiency cannot be achieved when the impedance of the FET is small, because the influences of the parasitic inductance of the drain, which had not been considered before, increases, in addition to the influences of the parasitic capacitance between the drain and the source.

In order to provide a radio frequency power amplifier which achieves high output power and high PAE, an aspect of the radio frequency power amplifier according to the present invention is a radio frequency power amplifier which performs class F operation. The radio frequency power amplifier includes: an amplifying element which amplifies an input signal and outputs the amplified input signal from an output terminal; and an output load circuit which includes a first resonant circuit and a second resonant circuit that are connected to the output terminal. The first resonant circuit has a resonance frequency higher than a frequency of a second harmonic of the input signal, and the second resonant circuit has a resonance frequency lower than a frequency of a third harmonic of the input signal. With reference to an output impedance of the amplifying element, the output load circuit has such an impedance looking into the output load circuit from the output terminal that a phase of a reflection coefficient at the second harmonic of the input signal is greater than 180 degrees and less than 360 degrees, and a phase of a reflection coefficient at the third harmonic of the input signal is greater than 0 degrees and less than 180 degrees.

Consequently, when the output impedance of the amplifying element is represented by an output resistance, a parasitic capacitance, and a parasitic inductance, the output load circuit has such an impedance that the synthetic impedance of the parasitic capacitance, the parasitic inductance, and the output load circuit (i) is a short circuit impedance at an even harmonic of the input signal and (ii) is an open circuit impedance at an odd harmonic of the input signal. Hence, also in the case of an output load circuit using a high-power amplifying element as an amplifying element, the load as seen from the drain terminal meets the class F load conditions, considering the influences of the parasitic capacitance and the parasitic inductance of the amplifying element, leading to high PAE.

Here, it may be that the first resonant circuit and the second resonant circuit are respectively a first series resonant circuit and a second series resonant circuit, each of the first series resonant circuit and the second series resonant circuit (i) including an inductive element and a capacitive element that are connected in series, and (ii) having one terminal connected to the output terminal, and an other terminal connected to ground.

As another embodiment, it may be that the first resonant circuit and the second resonant circuit are respectively a first open stub and a second open stub, each of the first open stub and the second open stub having one terminal connected to the output terminal, and an other terminal open.

As another embodiment, it may also be that the first resonant circuit and the second resonant circuit are respectively a first dielectric resonator and a second dielectric resonator, each of the first dielectric resonator and the second dielectric resonator having one terminal connected to the output terminal, and an other terminal open.

As another embodiment, it may be that the first resonant circuit is a third series resonant circuit including an inductive element and a capacitive element that are connected in series, and having one terminal connected to the output terminal, and an other terminal connected to ground, and the second resonant circuit includes: a series inductive element having one terminal connected to the output terminal; and a fourth series resonant circuit (i) including an inductive element and a capacitive element that are connected in series, and (ii) having one terminal connected to an other terminal of the series inductive element, and an other terminal connected to ground.

As another embodiment, it may be that the first resonant circuit is a third open stub having one terminal connected to the output terminal, and an other terminal open, and the second resonant circuit includes: a series inductive element having one terminal connected to the output terminal; and a fourth open stub having one terminal connected to an other terminal of the series inductive element, and an other terminal open.

As another embodiment, it may be that the first resonant circuit is a third dielectric resonator having one terminal connected to the output terminal, and an other terminal open, and the second resonant circuit includes: a series inductive element having one terminal connected to the output terminal; and a fourth dielectric resonator having one terminal connected to an other terminal of the series inductive element, and an other terminal open.

Specifically, it may be that in the output load circuit, the phase of the reflection coefficient at the second harmonic is 195 degrees or greater and 310 degrees or less, and the phase of the reflection coefficient at the third harmonic is 30 degrees or greater and 140 degrees or less. This steadily leads to a high-power and high-efficiency radio frequency power amplifier which performs class F operation.

Furthermore, in order to achieve the object, another aspect of the radio frequency power amplifier according to the present invention is a radio frequency power amplifier which performs an inverse class F operation. The radio frequency power amplifier includes: an amplifying element which amplifies an input signal and outputs the amplified input signal from an output terminal; and an output load circuit which includes a first resonant circuit and a second resonant circuit that are connected to the output terminal. The first resonant circuit has a resonance frequency lower than a frequency of a second harmonic of the input signal, and the second resonant circuit has a resonance frequency higher than a frequency of a third harmonic of the input signal. With reference to an output impedance of the amplifying element, the output load circuit has such an impedance looking into the output load circuit from the output terminal that a phase of a reflection coefficient at the second harmonic of the input signal is greater than 0 degrees and less than 180 degrees, and a phase of a reflection coefficient at the third harmonic of the input signal is greater than 180 degrees and less than 360 degrees.

Consequently, when the output impedance of the amplifying element is represented by an output resistance, a parasitic capacitance, and a parasitic inductance, the output load circuit has such an impedance that the synthetic impedance of the parasitic capacitance, the parasitic inductance, and the output load circuit (i) is an open circuit impedance at an even harmonic of the input signal and (ii) is a short circuit impedance at an odd harmonic of the input signal. Hence, also in the case of an output load circuit using a high-power amplifying element as an amplifying element, the load as seen from the drain terminal meets inverse class F load conditions, considering the influences of the parasitic capacitance and the parasitic inductance of the amplifying element, leading to high PAE.

Hereinafter, referring to the drawings, detailed descriptions are given of embodiments of the present invention. Each of the embodiments described below shows a general or specific example. The numerical values, shapes, materials, structural elements, the arrangement and connection of the structural elements shown in the following embodiments are mere examples, and therefore do not limit the scope of the present invention. The present invention is defined by the scope of the appended Claims. Therefore, among the structural elements in the following embodiments, structural elements not recited in any one of the independent claims are not necessarily required to achieve the object of the present invention, but are described as arbitrary structural elements.

(Embodiment 1)

Hereinafter, referring to the drawings, a description is given of a radio frequency power amplifier according to Embodiment 1.

Figure 1A:
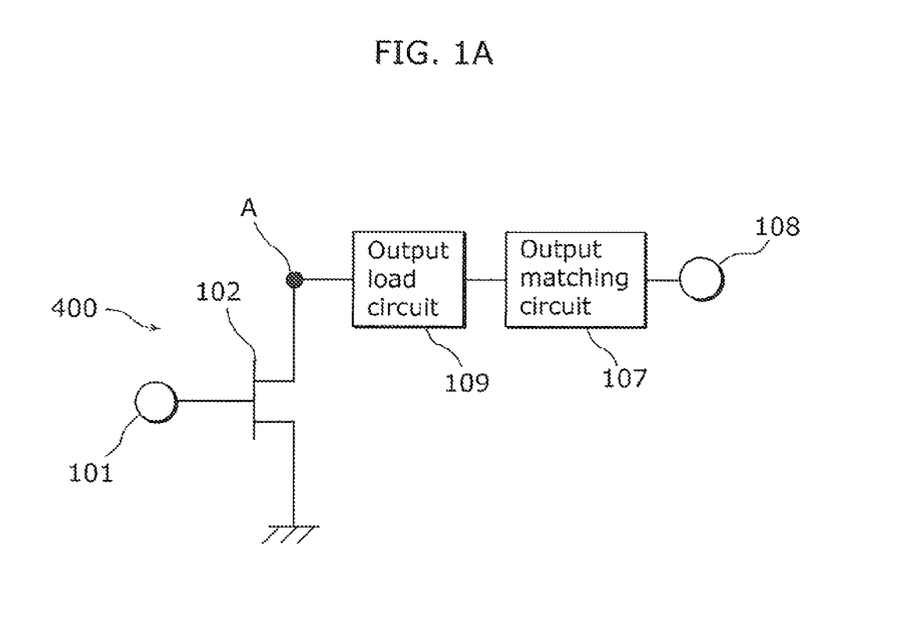
FIG. 1A is a circuit diagram of a radio frequency power amplifier according to Embodiment 1.
Figure 1B:
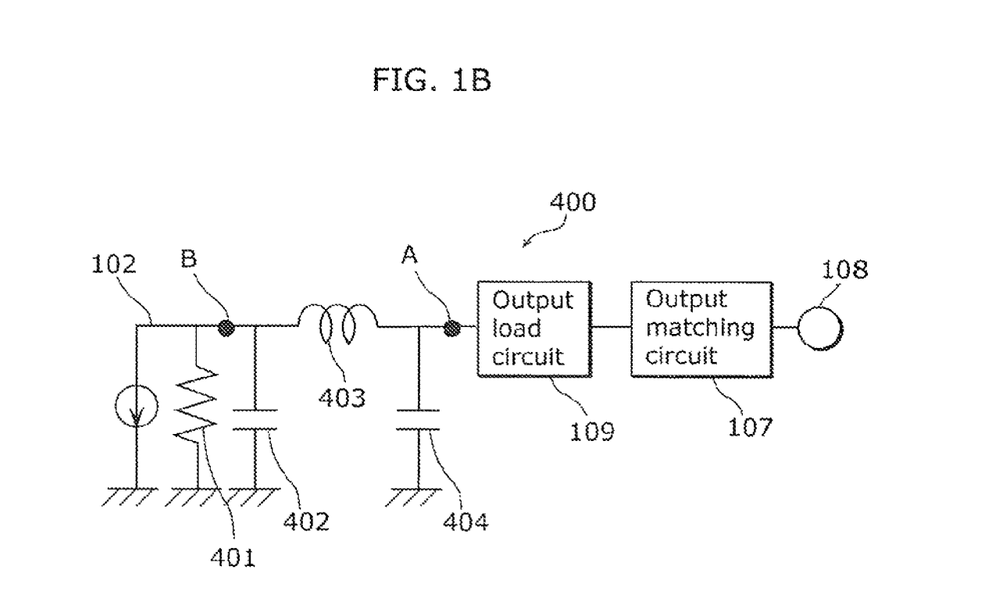
FIG. 1B is an equivalent circuit diagram of the radio frequency power amplifier according to Embodiment 1.

FIG. 1A is a schematic circuit diagram of a radio frequency power amplifier 400 according to Embodiment 1. FIG. 1B is an equivalent circuit diagram of the radio frequency power amplifier 400 according to Embodiment 1.

In FIG. 1A, the radio frequency power amplifier 400 includes: an amplifying element 102 (for example, FET) which amplifies a radio frequency signal that is an input signal; an output load circuit 109; and an output matching circuit 107. The radio frequency signal input from an input terminal 101 is amplified by the amplifying element 102, and is output from an output terminal 108 through the output load circuit 109 and the output matching circuit 107.

FIG. 1B is an equivalent circuit diagram where the output impedance of the amplifying element 102 in FIG. 1A is represented by an output resistance 401, a first parasitic capacitance 402, a parasitic inductance 403, and a second parasitic capacitance 404. The output resistance 401 is, for example, a resistance between a drain and a source formed in an intrinsic region of the amplifying element 102. The first parasitic capacitance 402 is, for example, a capacitance between the drain and the source formed in the intrinsic region of the amplifying element 102. The second parasitic capacitance 404 is, for example, a capacitance of an output electrode pad for outputting a signal from the intrinsic region of the amplifying element 102. The parasitic inductance 403 is, for example, an inductance of a drain wire in the intrinsic region of the transistor, or an inductance of a wire between the intrinsic region and the output electrode pad. In the equivalent circuit of the output side of the amplifying element 102 shown in FIG. 1B, the first parasitic capacitance 402 and the second parasitic capacitance 404 are separately shown; however, for simplification, the parasitic capacitance may be represented by only one of them.

In order to achieve class F operation, it is necessary to control the phase of reflection coefficient, at harmonics, looking into the output load circuit 109 from drain terminal B formed in the intrinsic region of the amplifying element 102 shown in FIG. 1B, instead of from the output terminal A of the amplifying element 102 shown in FIG. 1B. More specifically, class F operation conditions are satisfied by setting the impedance of the output load circuit 109 as seen from the drain terminal B to a short circuit impedance at an even harmonic and to an open circuit impedance at an odd harmonic.

In the present description, the term "phase of reflection coefficient" (or simply referred to as phase) refers to the phase of reflection coefficient on a complex plane (or a Smith chart), and is different from the phase of a load impedance. Furthermore, the term "harmonic" refers to a signal having a frequency which equals the integral multiple of the frequency of a signal input to the amplifying element 102.

Figure 2A:
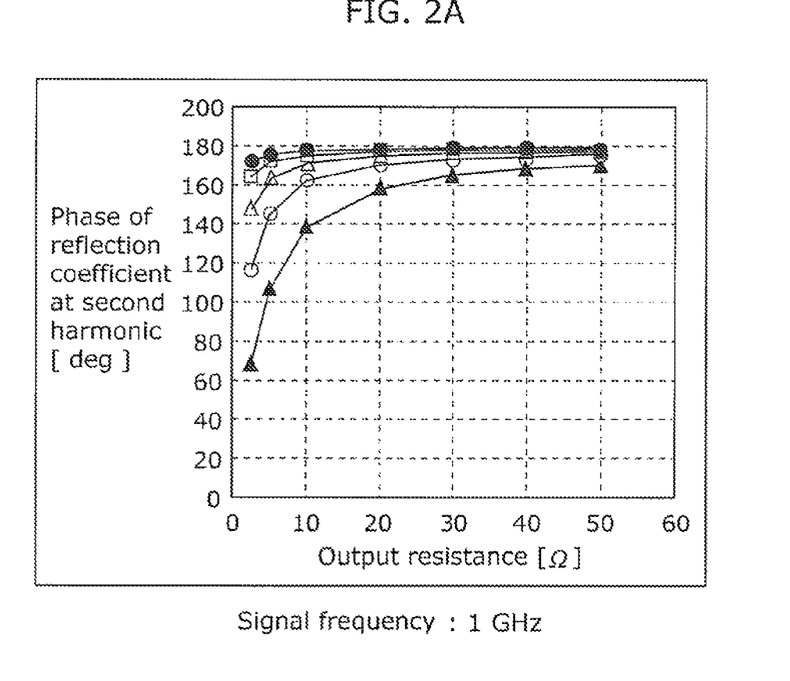
FIG. 2A is a diagram showing influences of an output resistance and a parasitic inductance on the phase of reflection coefficient at second harmonic when a signal frequency is 1 GHz.
Figure 2B:
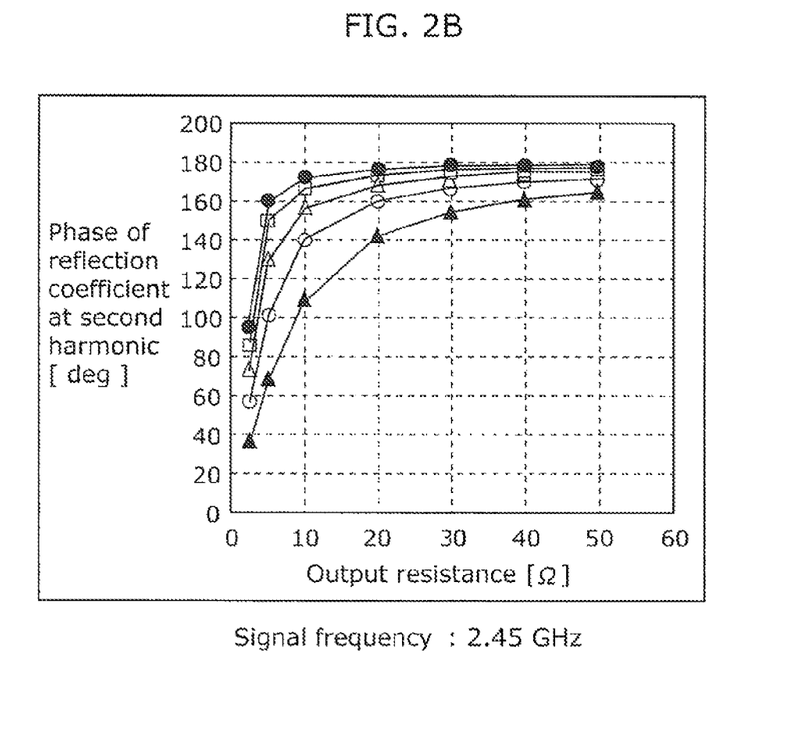
FIG. 2B is a diagram showing influences of an output resistance and a parasitic inductance on the phase of reflection coefficient at second harmonic when a signal frequency is 2.45 GHz.

FIG. 2A shows a result of the simulation of the relationship between the phase of reflection coefficient, at the second harmonic, looking into the load from the drain terminal B formed in the intrinsic region of the amplifying element 102 (vertical axis) and the output resistance 401 of the amplifying element 102 (horizontal axis) in the case where (i) a resonant circuit is used which has a short circuit impedance at the second harmonic as seen from the output terminal A of the amplifying element 102 (that is, the phase of reflection coefficient is 180 degrees) and (ii) the signal frequency is 1 GHz. FIG. 2B shows a result of the same simulation in the case where the signal frequency is 2.45 GHz. FIG. 2A and FIG. 2B show the inductance of the parasitic inductance 403 of 0.013 nH (black circles), 0.026 nH (white squares), 0.052 nH (white triangles), 0.104 nH (white circles), and 0.208 nH (black triangles).

FIG. 2A and FIG. 2B show that when the output resistance 401 is 20Ω or greater and the inductance of the parasitic inductance 403 is 0.052 nH or less, regardless of whether the signal frequency is 1 GHz or 2.45 GHz, the phase of the reflection coefficient, at the second harmonic, looking into the load from the drain terminal B formed in the intrinsic region of the amplifying element 102 is approximately 180 degrees, that is, an ideal phase. In such a case, as in the conventional technique, it is possible to achieve high PAE even when a resonant circuit that has a short circuit impedance at the second harmonic (that is, the phase of the reflection coefficient is 180 degrees) is connected to the output terminal of the amplifying element 102. However, when the output resistance 401 is 10Ω or less, or the inductance of the parasitic inductance 403 is 0.104 nH or greater, regardless of whether the signal frequency is 1 GHz or 2.45 GHz, high PAE cannot be achieved, because the phase of the reflection coefficient, at the second harmonic, looking into the load from the drain terminal B formed in the intrinsic region of the amplifying element 102 is far from 180 degrees, departing from the class F operation conditions. Hence, in the case where the output resistance 401 of the amplifying element 102 is 10Ω or less, or where the inductance of the parasitic inductance 403 of the amplifying element 102 is 0.104 nH or greater, it is necessary to configure the output load circuit 109 considering the parasitic inductance 403 of the amplifying element 102.

Furthermore, FIG. 2A shows the case where the signal frequency is 1 GHz, while FIG. 2B shows the case where the signal frequency is 2.45 GHz. As seen from the comparison between these two figures, the greater the signal frequency is, the greater the influences of the parasitic inductance 403 is likely to become. However, in the case where the signal frequency is 1 GHz, too, it is necessary to configure the output load circuit 109 considering the parasitic inductance 403 when the output resistance 401 is 10Ω or less, or the inductance of the parasitic inductance 403 is 0.104 nH or greater. In other words, the radio frequency power amplifier according to Embodiment 1 is capable of achieving high PAE by including the output load circuit 109 considering the parasitic inductance 403 that will be described later, particularly in the case where the frequency of an input signal to the amplifying element 102 is 1 GHz or greater.

Currently, in the case of a general FET which uses the amplifying element 102 as an amplifying element for a mobile communication terminal, the output resistance is 20Ω or greater; and thus, as in the conventional technique, high PAE can be obtained even when the FET uses, as an output terminal, a resonant circuit which has a short circuit impedance at the second harmonic (that is, the phase of the reflection coefficient is 180 degrees).

However, in the case where the amplifying element 102 is a high-power FET, such as a FET which outputs 100 W, the output resistance of the amplifying element 102 is low. This hinders the conventional technique from achieving high PAE. A FET which outputs 100 W or greater, generally have a gate width set to approximately 36 mm or greater. For example, when the gate width is 36 mm, the output resistance value is approximately 2.5Ω and the inductance of the parasitic inductance 403 is approximately 0.013 nH, This causes the phase of the reflection coefficient at the second harmonic to significantly depart from 180 degrees, as shown in FIG. 2A and FIG. 2B. As described, the present invention focuses on a problem which newly arises when an output load circuit is connected to a high-power FET having an output resistance of 10Ω or less.

The above output resistance value and the inductance of the parasitic inductance when the gate width is 36 mm are mere examples. Since the output resistance value and the inductance of the parasitic inductance differ depending on the configuration or layout of the amplifying element, the radio frequency power amplifier according to Embodiment 1 is not limited to the above values.

Next, a description is given of how to set the impedance of the output load circuit at the second harmonic and the third harmonic, considering the inductance of the parasitic inductance of an amplifying element.

First, a description is given of an output load circuit at the second harmonic. In order to set the load, at the second harmonic, looking into the output load circuit 109 from the drain terminal B formed in the intrinsic region of the amplifying element 102 shown in FIG. 1B, to a short circuit impedance (that is, set the phase of the reflection coefficient to 180 degrees), it is necessary to set the phase of the reflection coefficient at the second harmonic such that the sum of the phase rotation by the parasitic inductance 403 and the phase rotation by the output load circuit 190 equals 180 degrees. More specifically, the phase of the reflection coefficient, at the second harmonic, looking into the output load circuit 109 from the output terminal A of the amplifying element 102 shown in FIG. 1B is set to capacitive (greater than 180 degrees and less than 360 degrees), and the load, at the second harmonic, looking into the output load circuit 109 from the drain terminal B formed in the intrinsic region of the amplifying element 102 shown in FIG. 1B is set to a short circuit impedance (that is, set the phase of the reflection coefficient to 180 degrees) by the phase rotation of the parasitic inductance 403.

Here, the term "phase rotation" refers to the rotation of the phase of the reflection coefficient on a complex plane (Smith chart).

In the case where only parasitic capacitance (the first parasitic capacitance 402 and the second parasitic capacitance 404) is considered without considering the parasitic inductance 403 as in the conventional technique, the load, at the second harmonic, looking into the output load circuit 109 from the output terminal A of the amplifying element 102 shown in FIG. 1B is adjusted to a short circuit impedance (that is, the phase of the reflection coefficient is set to 180 degrees). Hence, as shown in FIG. 2A and FIG. 2B, the phase of the reflection coefficient, at the second harmonic, looking into the output load circuit 109 from the drain terminal B formed in the intrinsic region of the amplifying element 102 shown in FIG. 1B significantly shifts. Consequently, the conventional technique results in departing from the class F operation conditions, hindering achieving high PAE.

Next, a description is given of an output load circuit at the third harmonic. In order to set the load, at the third harmonic, looking into the output load circuit 109 from the drain terminal B formed in the intrinsic region of the amplifying element 102 shown in FIG. 18, to an open circuit impedance (that is, set the phase of the reflection coefficient to 0 degrees or 360 degrees), it is necessary to set the phase of the reflection coefficient at the third harmonic such that the sum of the phase rotation by the parasitic inductance 403, the phase rotation by the parasitic capacitance (the first parasitic capacitance 402 and the second parasitic capacitance 404), and the phase rotation by the output load circuit 109 equals 0 degrees or 360 degrees. More specifically, the phase of the reflection coefficient, at the third harmonic, looking into the output load circuit 109 from the output terminal A of the amplifying element 102 shown in FIG. 1B is set to inductive (greater than 0 degrees and less than 180 degrees), and the load, at the third harmonic, looking into the output load circuit 109 from the drain terminal B formed in the intrinsic region of the amplifying element 102 shown in FIG. 16 is set to an open circuit impedance (that is, the phase of the reflection coefficient is set to 0 degrees or 360 degrees) by the phase rotation of the parasitic inductance 403 and the parasitic capacitance (the first parasitic capacitance 402 and the second parasitic capacitance 404).

In the case where only parasitic capacitance (the first parasitic capacitance 402 and the second parasitic capacitance 404) is considered without considering the parasitic inductance 403 as in the conventional technique, the sum of the phase rotation by the output load circuit 109 and the parasitic capacitance (the first parasitic capacitance 402 and the second parasitic capacitance 404) equals 0 degrees or 360 degrees. Due to the influences of the phase rotation by the parasitic inductance 403, the phase of the reflection coefficient, at the third harmonic, looking into the output load circuit 109 from the drain terminal B formed in the intrinsic region of the amplifying element 102 shown in FIG. 1B significantly shifts. Consequently, the conventional technique results in departing from the class F operation conditions, hindering achieving high PAE.

In conclusion, the radio frequency power amplifier 400 according to Embodiment 1 includes the amplifying element 102 which amplifies an input signal and outputs the amplified signal from the output terminal A, and the output load circuit 109 connected to the output terminal A. With reference to the output impedance of the amplifying element 102, the output load circuit 109 has such an impedance looking into the output load circuit 109 from the output terminal A that the phase of the reflection coefficient at the second harmonic of the input signal is greater than 180 degrees and less than 360 degrees, and the phase of the reflection coefficient at the third harmonic of the input signal is greater than 0 degrees and less than 180 degrees.

As a result, when the output impedance of the amplifying element 102 is represented by the output resistance 401, the parasitic capacitance (the first parasitic capacitance 402 and the second parasitic capacitance 404), and the parasitic inductance 403, the output load circuit 109 has such an impedance that the synthetic impedance of the parasitic capacitance (the first parasitic capacitance 402 and the second parasitic capacitance 404), the parasitic inductance 403, and the output load circuit 109 is a short circuit impedance at an even harmonic (the second harmonic in Embodiment 1) of the input signal, and is an open circuit impedance at an odd harmonic (the third harmonic in Embodiment 1) of the input signal.

As a result, also in the case where a high-power FET is used as the amplifying element 102, too, the load as seen from the drain terminal satisfies the class F load conditions considering the influences of the parasitic capacitance and the parasitic inductance of the FET, leading to high PAE.

Descriptions have been given above of the conditions for causing the radio frequency power amplifier 400 to perform class F operation. Instead, by setting the load, at an even harmonic, looking into the output load circuit 109 from the drain terminal B formed in the intrinsic region of the amplifying element 102 shown in FIG. 16, to an open circuit impedance (that is, set the phase of the reflection coefficient to 0 degrees or 360 degrees), and setting the load, at an odd harmonic, to a short circuit impedance (that is, set the phase of the reflection coefficient to 180 degrees), the radio frequency power amplifier 400 satisfies the conditions for inverse F class operation. As a result, high PAE can be achieved.

More specifically, the radio frequency power amplifier according to Embodiment 1 may be a radio frequency power amplifier which satisfies conditions for inverse class F operation. It may be that the radio frequency power amplifier includes the amplifying element 102 which amplifies an input signal and outputs the amplified signal from the output terminal A, and the output load circuit 109 connected to the output terminal A. With reference to the output impedance of the amplifying element 102, the output load circuit 109 may have such an impedance looking into the output load circuit 109 from the output terminal A that the phase of the reflection coefficient at the second harmonic of the input signal is greater than 0 degrees and less than 180 degrees, and the phase of the reflection coefficient at the third harmonic of the input signal is greater than 180 degrees and less than 360 degrees.

As a result, when the output impedance of the amplifying element 102 is represented by the output resistance 401, the parasitic capacitance (the first parasitic capacitance 402 and the second parasitic capacitance 404), and the parasitic inductance 403, the output load circuit 109 has such an impedance that the synthetic impedance of the parasitic capacitance (the first parasitic capacitance 402 and the second parasitic capacitance 404), the parasitic inductance 403, and the output load circuit 109 is an open circuit impedance at an even harmonic (the second harmonic in Embodiment 1) of the input signal, and is a short circuit impedance at an odd harmonic (the third harmonic in Embodiment 1) of the input signal.

As a result, in the case where a high-power FET is used as the amplifying element 102, too, the load as seen from the drain terminal satisfies the inverse class F load conditions considering the influences of the parasitic capacitance and the parasitic inductance of the FET, leading to high PAE.

(Embodiment 2)

Next, referring to the drawings, more specific descriptions are given of the circuit configuration of the radio frequency power amplifier in Embodiment 2.

Figure 3:
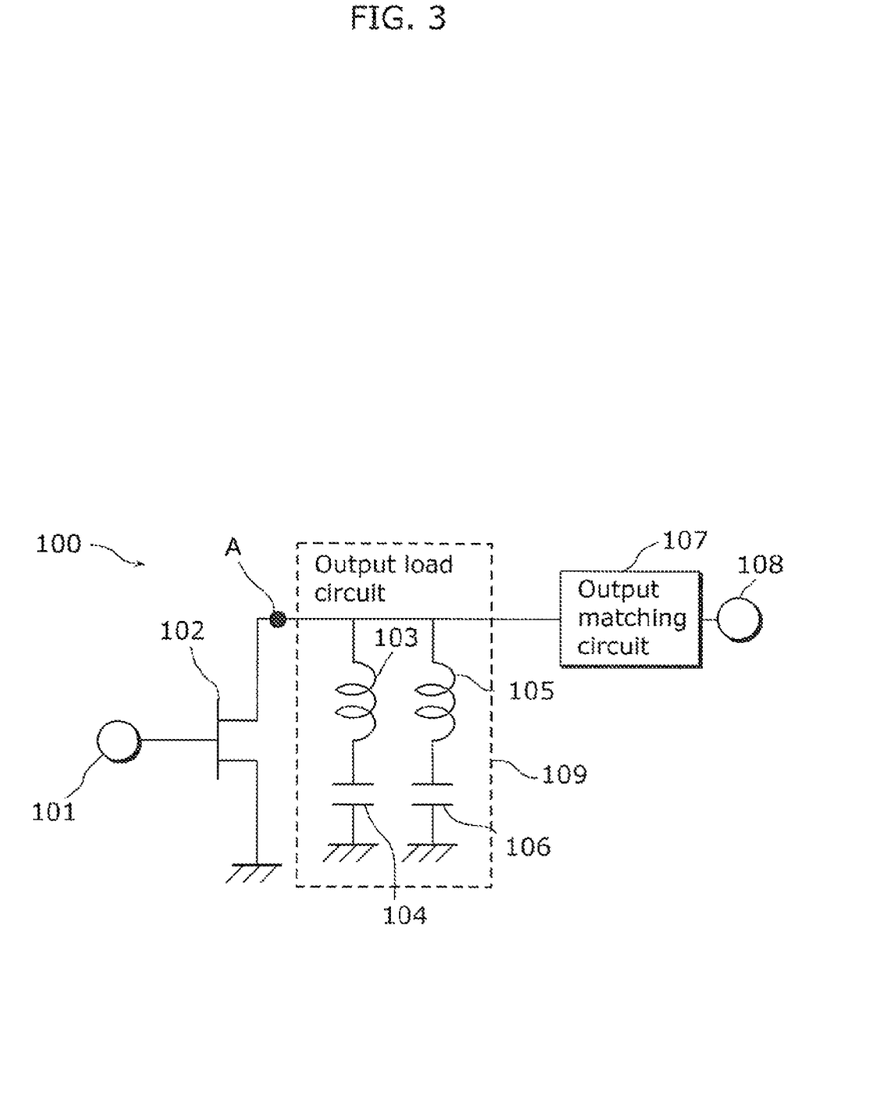
FIG. 3 is a circuit diagram of a radio frequency power amplifier according to Embodiment 2.

FIG. 3 is a circuit diagram of a radio frequency power amplifier 100 according to Embodiment 2.

The radio frequency power amplifier 100 in FIG. 3 includes an amplifying element 102 (for example, FET) which amplifies a radio frequency signal, an output load circuit 109, and an output matching circuit 107. The radio frequency signal input from an input terminal 101 is amplified by the amplifying element 102, and is output from an output terminal 108 through the output load circuit 109 and the output matching circuit 107.

The output load circuit 109 includes: a first series resonant circuit where an inductor 103 serving as an inductive element and a capacitor 104 serving as a capacitive element are connected in series; and a second series resonant circuit where an inductor 105 serving as an inductive element and a capacitor 106 serving as a capacitive element are connected in series. Each of the first series resonant circuit and the second series resonant circuit has one terminal connected to the output terminal A of the amplifying element 102 and the other terminal connected to ground. The first series resonant circuit is an example of the first resonant circuit and the second series resonant circuit is an example of the second resonant circuit.

Here, the resonance frequency of the first series resonant circuit is set to a frequency higher than twice as large as the signal frequency of the radio frequency signal input from the input terminal 101 (the frequency of the second harmonic). As a result, it is possible to set the phase of the reflection coefficient, at the frequency twice as large as the signal frequency (the second harmonic), looking into the load including the output load circuit 109 and the output matching circuit 107 from the output terminal A of the amplifying element 102, to be greater than 180 degrees. Specifically, the phase of the reflection coefficient at the second harmonic can be adjusted to capacitive (greater than 180 degrees and less than 360 degrees).

Furthermore, the resonance frequency of the second series resonant circuit is set to a frequency lower than the frequency three times as large as the signal frequency of the radio frequency signal input from the input terminal 101 (the frequency of the third harmonic). As a result, it is possible to set the phase of the reflection coefficient, at the frequency three times as large as the signal frequency (the third harmonic), looking into the load including the output load circuit 109 and the output matching circuit 107 from the output terminal A of the amplifying element 102, to be less than 180 degrees. Specifically, the phase of the reflection coefficient at the third harmonic can be adjusted to inductive (greater than 0 degrees and less than 180 degrees).

Strictly speaking, the phases of the reflection coefficients at the second and third harmonics are influenced not only by the output load circuit 109 but also by the output matching circuit 107. Conversely, each resonator included in the output load circuit 109 have no small effect on the signal frequency. Hence, it is preferable to design phase and a load including the output load circuit 109 and the output matching circuit 107. In this case, an output load circuit may be designed considering that the output load circuit included in the radio frequency power amplifier according to the present invention corresponds to a circuit including the output load circuit 109 and the output matching circuit 107 according to Embodiment 2.

Now, specific numerical examples are given. The amplifying element 102 is represented by the equivalent circuit shown in FIG. 18. Suppose a case where the output resistance 401 is 1.3Ω, the first parasitic capacitance 402 is 8.82 pF, the value of the second parasitic capacitance 404 is 1.6 pF, and the parasitic inductance 403 is 0.013 nH. In this case, when the signal frequency is 2.45 GHz, by setting the phase of the reflection coefficient at the second harmonic to 221.6 degrees, and setting the phase of the reflection coefficient at the third harmonic to 81.3 degrees, in the output load circuit 109, the impedance of the load looking into the output load circuit 109 from the drain terminal B can be set to a short circuit impedance at the second harmonic and an open circuit impedance at the third harmonic.

Furthermore, when the load including the output load circuit 109 and the output matching circuit 107 is seen from the output terminal A of the amplifying element 102, by adjusting the phase of the reflection coefficient at the second harmonic to 195 degrees or greater and 310 degrees or less and adjusting the phase of the reflection coefficient at the third harmonic to 30 degrees or greater and 140 degrees or less, the load as seen from the drain terminal B becomes closer to the class F load conditions, considering the influences of the parasitic capacitance and the parasitic inductance of the high-power amplifying element 102. The ranges of the phases of the reflection coefficients at the second and third harmonics above correspond to the impedance near the short circuit impedance or the open circuit impedance. As a result, high PAE can be obtained.

Furthermore, each of the phases of the reflection coefficients at the second and third harmonics of the impedance of the load represents the phase of the reflection coefficient looking into the load including the output load circuit 109 and the output matching circuit 107 from the output terminal A of the amplifying element 102, with reference to the impedance looking into the amplifying element 102 from the output terminal A of the amplifying element 102. More specifically, each phase is expressed by the phase of the reflection coefficient $((z-1)/(z+1))$ where z represents a normalized impedance z of a load normalized by the output impedance of the amplifying element 102.

For example, in the case where the impedance at the signal frequency looking into the amplifying element 102 from the output terminal A of the amplifying element 102 (that is, the output impedance of the amplifying element 102) is 1.3−j×0.5Ω, it is preferable to set the phase of the reflection coefficient at the second harmonic to 195 degrees or greater and 310 degrees or less, and set the phase of the reflection coefficient at the third harmonic to 30 degrees or greater and 140 degrees or less, with reference to the impedance 1.3−j×0.5Ω.

Figure 4:
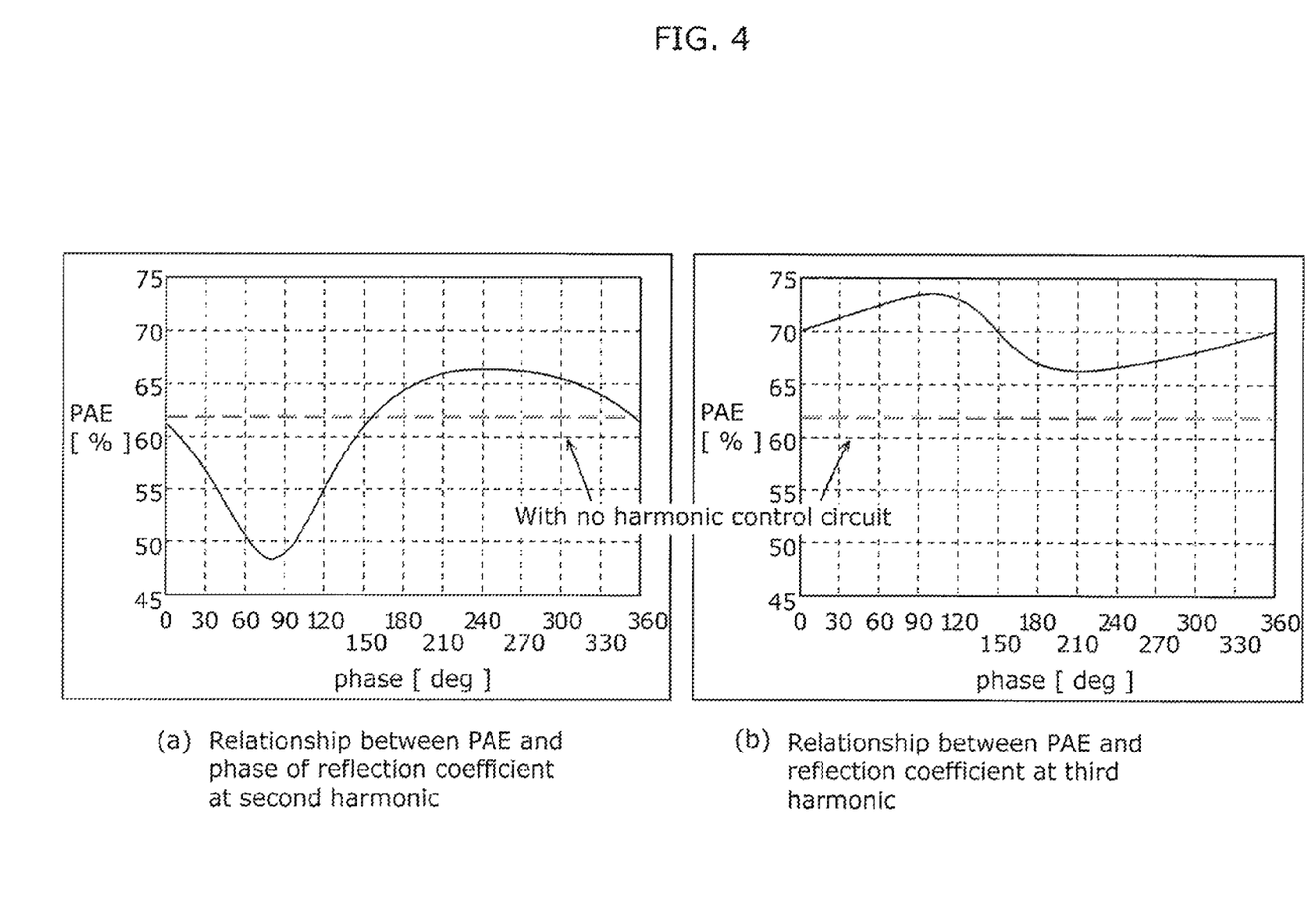
FIG. 4 shows relationship between PAE and phase of reflection coefficient at second and third harmonics.

In FIG. 4, (a) shows a result of a simulation of the relationship between PAE and the phase of the reflection coefficient, at the second harmonic, looking into the load including the output load circuit 109 and the output matching circuit 107 from the output terminal A of the amplifying element 102. In FIG. 4, (b) shows a result of a simulation of the relationship between PAF and the phase of the reflection coefficient, at the third harmonic, looking into the load including the output load circuit 109 and the output matching circuit 107 from the output terminal A of the amplifying element 102.

In the simulations, a FET model having a gate width of 36 mm using GaN was used as the amplifying element 102, and ideal circuits with no loss were used for the output load circuit 109 and the output matching circuit 107. Matching loss was not considered. Furthermore, for DC bias for driving the amplifying element 102, gate voltage was applied from the input terminal 101, and drain voltage and current were applied from the output terminal 108. Furthermore, the signal frequency was 2.45 GHz, power (Pin) input to the amplifying element 102 was 35 dBm at which the amplifying element 102 enters the saturation region, and PAE was calculated based on the DC supply power (Pdc) and output power (Pout) using the following equation 1.

$$PAE=(Pout-Pin)/Pdc \quad \text{(Equation 1)}$$

In FIG. 4, (a) shows a result of a simulation of the change of PAE caused when the phase (horizontal axis) of the reflection coefficient, at the second harmonic, looking into the load including the output load circuit 109 and the output matching circuit 107 from the output terminal A of the amplifying element 102 is changed with reference to the impedance looking into the amplifying element 102 from the output terminal A of the amplifying element 102. Here, a third output load circuit was not used.

The dashed line in. FIG. 4(a) represents PAE obtained when the output load circuit 109 is not used. As seen from FIG. 4(a), when the phase of the reflection coefficient at the second harmonic is between around 160 degrees and around 350 degrees, PAE exceeds the value of the dashed line. Furthermore, when the phase of the reflection coefficient at the second harmonic is between 195 degrees and 310 degrees inclusive, second harmonic components are effectively processed, and thus PAE exceeds 65%, In FIG. 4, (b) shows a result of a simulation of the change of PAE caused when the phase (horizontal axis) of the reflection coefficient, at the third harmonic, looking into the load including the output load circuit 109 and the output matching circuit 107 from the output terminal A of the amplifying element 102 is changed with reference to the impedance looking into the amplifying element 102 from the output terminal A of the amplifying element 102. Here, the phase of the reflection coefficient at the second harmonic was 250 degrees.

In the similar manner to (a) in FIG. 4, the dashed line in FIG. 4(b) represents PAE obtained when the output load circuit 109 is not used. As seen from FIG. 4(b), when the phase of the reflection coefficient at the third harmonic is within a range from 30 degrees to 140 degrees inclusive, third harmonic components were effectively processed. Only the output load circuit was used, and PAE improved by 5% or more compared to the PAE (66.2%) in FIG. 4(a) which was adjusted to the optimal phase.

Here, the first and second resonant circuits of the output load circuit 109 each includes an inductor and a capacitor; however, the present invention is not limited to this example. Instead of the LC series resonant circuits, open stubs as shown in FIG. 5A (first open stub 211 and second open stub 212), dielectric resonators as shown in FIG. 5B (first dielectric resonator 221 and second dielectric resonator 222), series resonant circuits of a transmission line and a capacitive element, or the like may be included.

Figure 5A:
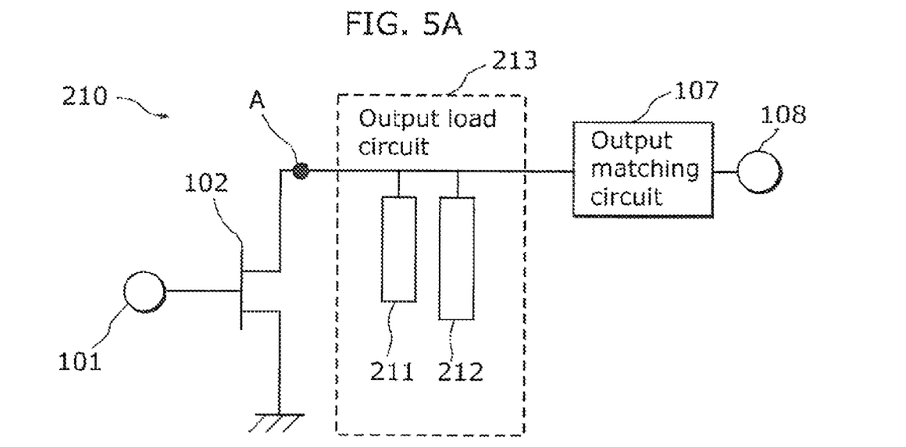
FIG. 5A is a circuit diagram of a radio frequency power amplifier according to Variation of Embodiment 2.

More specifically, in the radio frequency power amplifier 210 shown in FIG. 5A, the output load circuit 213 includes a first open stub 211 and a second open stub 212 each having one terminal connected to the output terminal A and the other terminal open. The resonance frequency of the first open stub 211 is set to be higher than the frequency of the second harmonic, and the resonance frequency of the second open stub 212 is set to be lower than the frequency of the third harmonic. Each of the first open stub 211 and the second open stub 212 includes, for example, a transmission line such as a strip line or a microstrip line. The first open stub 211 and the second open stub 212 are examples of the first resonant circuit and the second resonant circuit, respectively.

Figure 5B:
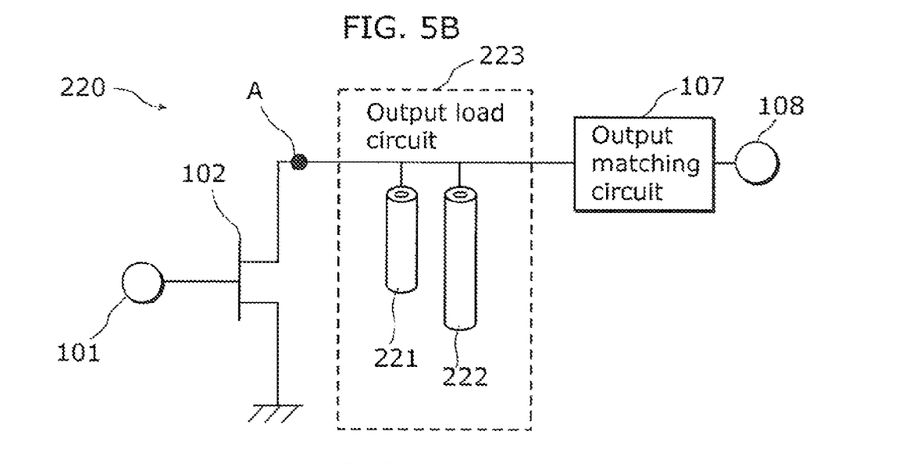
FIG. 5B is a circuit diagram of a radio frequency power amplifier according to another Variation of Embodiment 2.

Furthermore, in the radio frequency power amplifier 220 shown in FIG. 5B, the output load circuit 223 includes a first dielectric resonator 221 and a second dielectric resonator 222 each having one terminal connected to the output terminal A and the other terminal open. The resonance frequency of the first dielectric resonator 221 is set to be higher than the frequency of the second harmonic, and the resonance frequency of the second dielectric resonator is set to be lower than the frequency of the third harmonic. The first dielectric resonator 221 and the second dielectric resonator 222 are examples of the first resonant circuit and the second resonant circuit, respectively.

The output load circuits 213 and 223 having such configuration also provide the advantageous effects similar to those of the output load circuit 109.

Furthermore, the result of the simulation with the signal frequency of 2.45 GHz was shown as an example; however, even with a different signal frequency, efficient operation of the high-power amplifying element can be obtained by considering the influences of the parasitic capacitance and the parasitic inductance.

(Embodiment 3)

Next, referring to the drawings, a description is given of another specific circuit configuration of the radio frequency power amplifier according to the present invention in Embodiment 3.

Figure 6:
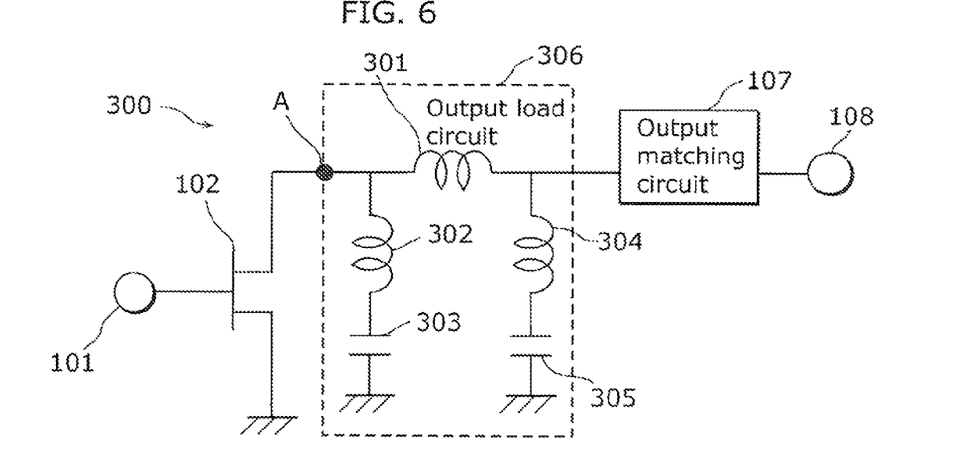
FIG. 6 is a circuit diagram of a radio frequency power amplifier according to Embodiment 3.

FIG. 6 is a circuit diagram of a radio frequency power amplifier 300 according to Embodiment 3.

Comparing the radio frequency power amplifier 300 in FIG. 6 with the radio frequency power amplifier 100 in FIG. 3, the output load circuit 306 has a circuit configuration different from the output load circuit 109. The other circuit configurations are the same, and thus, the same referential numerals are used and their detailed descriptions are not given.

The output load circuit 306 in FIG. 6 includes: a third series resonant circuit which includes an inductor 302 serving as an inductive element and a capacitor 303 serving as a capacitive element that are connected in series; a fourth series resonant circuit which includes an inductor 304 serving as an inductive element and a capacitor 305 serving as a capacitive element that are connected in series; and a series inductive element (inductor) 301 which connects the amplifying element 102 and the output matching circuit 107. The third series resonant circuit has one terminal connected to the output terminal A of the amplifying element 102 and the other terminal connected to ground. The series inductive element 301 has one terminal connected to the output terminal A (in other words, one terminal of the inductor 302). The fourth series resonant circuit has one terminal connected to the other terminal of the series inductive element 301, and the other terminal connected to ground. The third series resonant circuit is an example of the first resonant circuit, and a circuit including the series inductive element (inductor) 301 and the fourth series resonant circuit is an example of the second resonant circuit.

Here, the resonance frequency of the third series resonant circuit is set to a frequency higher than twice as large as the signal frequency of the radio frequency signal input from the input terminal 101 (the frequency of second harmonic). As a result, it is possible to set the phase of the reflection coefficient, at the second harmonic, looking into the load including the output load circuit 306 and the output matching circuit 107 from the output terminal A of the amplifying element 102, to be greater than 180 degrees. Specifically, the phase of the reflection coefficient at the second harmonic can be adjusted to capacitive (greater than 180 degrees and less than 360 degrees).

Furthermore, the resonance frequency for resonating, in series, the series inductive element 301 and the fourth series resonant circuit is set to a frequency lower than three times as large as the signal frequency of the radio frequency signal input from the input terminal 101 (the frequency of third harmonic). As a result, it is possible to set the phase of the reflection coefficient, at the third harmonic, looking into the load including the output load circuit 306 and the output matching circuit 107 from the output terminal A of the amplifying element 102, to be smaller than 180 degrees. Specifically, the phase of the reflection coefficient at the third harmonic can be adjusted to inductive (greater than 0 degrees and less than 180 degrees).

The phases of the reflection coefficients at the second and third harmonics are influenced not only by the output load circuit 306 but also by the output matching circuit 107. Conversely, each resonator included in the output load circuit 306 have no small effect on the signal frequency. Hence, it is preferable to comprehensively design the output load circuit 306 and the output matching circuit 107. In this case, an output load circuit may be designed considering that the output load circuit included in the radio frequency power amplifier according to the present invention corresponds to a circuit including the output load circuit 109 and the output matching circuit 107 according to Embodiment 3.

Furthermore, when the load including the output load circuit 306 and the output matching circuit 107 is seen from the output terminal A of the amplifying element 102, by adjusting the phase of the reflection coefficient at the second harmonic to 195 degrees or greater and 310 degrees or less and adjusting the phase of the reflection coefficient at the third harmonic to 30 degrees or greater and 140 degrees or less, the load seen from the drain terminal becomes closer to the class F load conditions, considering the influences of the parasitic capacitance and the parasitic inductance of the high-power amplifying element 102. As a result, high PAE can be obtained.

Here, the third and fourth series resonant circuits of the output load circuit 306 each includes an inductive element and a capacitive element; however, the present invention is not limited to this example. Instead of the series resonant circuits, open stubs as shown in FIG. 7A (a third open stub 312 and a fourth open stub 313), dielectric resonators as shown in FIG. 7B (a third dielectric resonator 322 and a fourth dielectric resonator 323), series resonant circuits of a transmission line and a capacitive element, or the like may be used Furthermore, the series inductive element 301 includes an inductor, but may include a transmission line instead of the inductor.

Figure 7A:
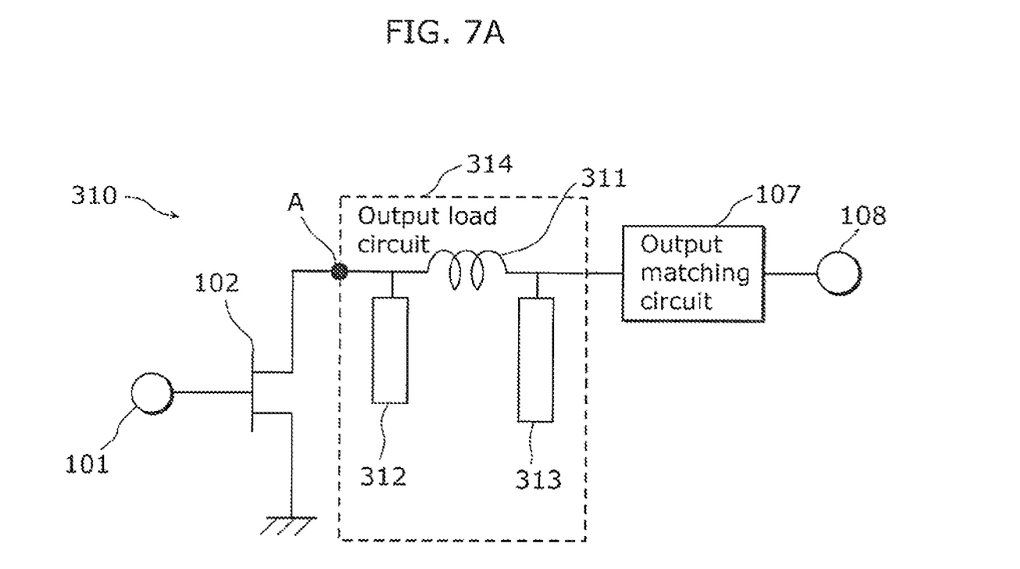
FIG. 7A is a circuit diagram of a radio frequency power amplifier according to Variation of Embodiment 3.

More specifically, in the radio frequency power amplifier 310 shown in FIG. 7A, the output load circuit 314 includes: a third open stub 312 having one terminal connected to the output terminal A and the other terminal open; a series inductive element (inductor) 311 having one terminal connected to the output terminal A; and a fourth open stub 313 having one terminal connected to the other terminal of the series inductive element 311 and the other terminal open. The resonance frequency of the third open stub 312 is set to be higher than the second harmonic, and the resonance frequency for resonating, in series, the series inductive element 311 and the fourth open stub 313 is set to be lower than the third harmonic. Each of the third open stub 312 and the fourth open stub 313 includes, for example, a transmission line such as a strip line or a microstrip line. The third open stub 312 is an example of the first resonant circuit, and a circuit including the series inductive element (inductor) 311 and the fourth open stub 313 is an example of the second resonant circuit.

Figure 7B:
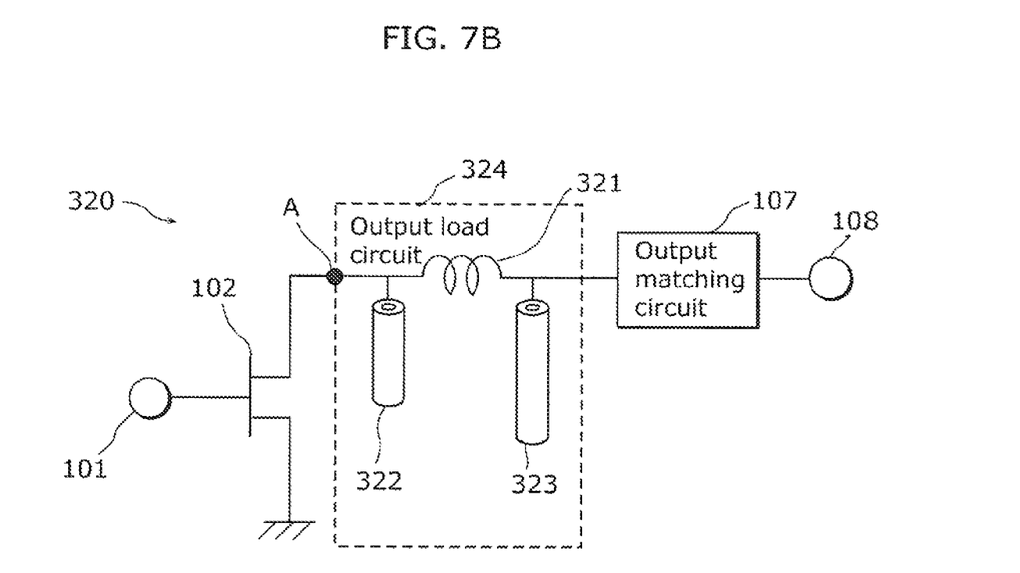
FIG. 7B is a circuit diagram of a radio frequency power amplifier according to another Variation of Embodiment 3.

Furthermore, in the radio frequency power amplifier 320 shown in FIG. 7B, the output load circuit 324 includes; a third dielectric resonator 322 having one terminal connected to the output terminal A and the other terminal open; a series inductive element (inductor) 321 having one terminal connected to the output terminal A; and a fourth dielectric resonator 323 having one terminal connected to the other terminal of the series inductive element 321 and the other terminal open. The resonance frequency of the third dielectric resonator 322 is set to be higher than the second harmonic, and the resonance frequency for resonating, in series, the series inductive element 321 and the fourth dielectric resonator 323 is set to be lower than the third harmonic. The third dielectric resonator 322 is an example of the first resonant circuit, and a circuit including the series inductive element (inductor) 321 and the fourth dielectric resonator 323 is an example of the second resonant circuit.

The output load circuits 314 and 324 having such configuration also provide the advantageous effects similar to those of the output load circuit 109.

The radio frequency power amplifier according to the present invention has been described based on Embodiments 1 to 3; however, the present invention is not limited to these embodiments. Possible variations which include changes added by a person skilled in the art in his/her conceivable range may be involved in the present invention as long as the variations are not depart from the principles of the present invention. Each structural element or characteristic part in the embodiments may be arbitrarily combined without departing from the principles of the present invention.

For example, in the embodiments, descriptions have been given of the second harmonic as an example of even harmonics. It may also be that the radio frequency power amplifier is designed on the assumption that the even harmonics also include higher even harmonics, such as the fourth harmonic, in addition to the second harmonic. In this case, as an output load circuit, a circuit is required to be included which has properties at the higher even harmonics that are similar to the properties at the second harmonic.

Similarly, in the embodiments, descriptions have been given of the third harmonic as an example of odd harmonics. It may also be that the radio frequency power amplifier is designed on the assumption that the odd harmonics also includes higher odd harmonics, such as the fifth harmonic, in addition to the third harmonic. In this case, as an output load circuit, a circuit is required to be included which have properties at the higher odd harmonics that are similar to the properties at the third harmonic.

INDUSTRIAL APPLICABILITY

The present invention is applicable to a radio frequency power amplifier, such as a radio frequency power amplifier used for a mobile communication terminal or base station, or for a home appliance using microwaves, such as a microwave oven.

REFERENCE SIGNS LIST

100, 210, 220, 300, 310, 320, 400 Radio frequency power amplifier
101 Input terminal
102 Amplifying element
103, 105, 302, 304 Inductor (inductive element)
104, 106, 303, 305 Capacitor (capacitive element)
107 Output matching circuit
108 Output terminal
109, 213, 223, 306, 314, 324 Output load circuit
211 First open stub
212 Second open stub
221 First dielectric resonator
222 Second dielectric resonator
301, 311, 321 Series inductive element (Inductor
312 Third open stub
313 Fourth open stub
322 Third dielectric resonator
323 Fourth dielectric resonator
401 Output resistance
402 First parasitic capacitance
403 Parasitic inductance
404 Second parasitic capacitance

The invention claimed is:

1. A radio frequency power amplifier which performs class F operation, comprising:
an amplifying element which amplifies an input signal and outputs the amplified input signal from an output terminal; and
an output load circuit which includes a first resonant circuit and a second resonant circuit that are connected to the output terminal,
wherein the first resonant circuit has a resonance frequency higher than a frequency of a second harmonic of the input signal,
the second resonant circuit has a resonance frequency lower than a frequency of a third harmonic of the input signal, and
with reference to an output impedance of the amplifying element looking into the amplifying element from the output terminal of the amplifying element, the output load circuit has such an impedance looking into the output load circuit from the output terminal of the amplifying element that a phase of a reflection coefficient at the second harmonic of the input signal is greater than 180 degrees and less than 360 degrees, and a phase of a reflection coefficient at the third harmonic of the input signal is greater than 0 degrees and less than 180 degrees, each of the phase of the reflection coefficient at the second harmonic and the phase of the reflection coefficient at the third harmonic being expressed by a phase of a reflection coefficient $((z-1)/(z+1))$ where z represents a normalized impedance of a load normalized by the output impedance of the amplifying element.

2. The frequency power amplifier according to claim 1, wherein the first resonant circuit and the second resonant circuit are respectively a first series resonant circuit and a second series resonant circuit, each of the first series resonant circuit and the second series resonant circuit (i) including an inductive element and a capacitive element that are connected in series, and (ii) having one terminal connected to the output terminal, and an other terminal connected to ground.

3. The frequency power amplifier according to claim 1, wherein the first resonant circuit and the second resonant circuit are respectively a first open stub and a second open stub, each of the first open stub and the second open stub having one terminal connected to the output terminal, and an other terminal open.

4. The frequency power amplifier according to claim 1, wherein the first resonant circuit and the second resonant circuit are respectively a first dielectric resonator and a second dielectric resonator, each of the first dielectric resonator and the second dielectric resonator having one terminal connected to the output terminal, and an other terminal open.

5. The frequency power amplifier according to claim 1, wherein the first resonant circuit includes a first series resonant circuit including an inductive element and a capacitive element that are connected in series, and having one terminal connected to the output terminal, and an other terminal connected to ground, and the second resonant circuit includes:

a series inductive element having one terminal connected to the output terminal; and a second series resonant circuit (i) including an inductive element and a capacitive element that are connected in series, and (ii) having one terminal connected to an other terminal of the series inductive element, and an other terminal connected to ground.

6. The frequency power amplifier according to claim 1, wherein the first resonant circuit includes a first open stub having one terminal connected to the output terminal, and an other terminal open, and the second resonant circuit includes:

a series inductive element having one terminal connected to the output terminal; and a second open stub having one terminal connected to an other terminal of the series inductive element, and an other terminal open.

7. The frequency power amplifier according to claim 1, wherein the first resonant circuit includes a first dielectric resonator having one terminal connected to the output terminal, and an other terminal open, and the second resonant circuit includes:

a series inductive element having one terminal connected to the output terminal; and a second dielectric resonator having one terminal connected to an other terminal of the series inductive element, and an other terminal open.

8. The frequency power amplifier according to claim 1, wherein, in the output load circuit, the phase of the reflection coefficient at the second harmonic is 195 degrees or greater and 310 degrees or less, and the phase of the reflection coefficient at the third harmonic is 30 degrees or greater and 140 degrees or less.

9. The frequency power amplifier according to claim 1, wherein, when the output impedance of the amplifying element is represented by an output resistance, a parasitic capacitance, and a parasitic inductance, the output load circuit has such an impedance that a synthetic impedance of the parasitic capacitance, the parasitic inductance, and the output load circuit is (i) a short circuit impedance at an even harmonic of the input signal, and (ii) an open circuit impedance at an odd harmonic of the input signal.

10. A radio frequency power amplifier which performs an inverse class F operation, comprising:

an amplifying element which amplifies an input signal and outputs the amplified input signal from an output terminal; and an output load circuit which includes a first resonant circuit and a second resonant circuit that are connected to the output terminal, wherein the first resonant circuit has a resonance frequency lower than a frequency of a second harmonic of the input signal, the second resonant circuit has a resonance frequency higher than a frequency of a third harmonic of the input signal, and with reference to an output impedance of the amplifying element looking into the amplifying element from the output terminal of the amplifying element, the output load circuit has such an impedance looking into the output load circuit from the output terminal of the amplifying element that a phase of a reflection coefficient at the second harmonic of the input signal is greater than 0 degrees and less than 180 degrees, and a phase of a reflection coefficient at the third harmonic of the input signal is greater than 180 degrees and less than 360 degrees, each of the phase of the reflection coefficient at the second harmonic and the phase of the reflection coefficient at the third harmonic being expressed by a phase of a reflection coefficient $((z-1)/(z+1))$ where z represents a normalized impedance of a load normalized by the output impedance of the amplifying element.

11. The frequency power amplifier according to claim 10, wherein, when an output impedance of the amplifying element is represented by an output resistance, a parasitic capacitance, and a parasitic inductance, the output load circuit has such an impedance that a synthesis impedance of the parasitic capacitance, the parasitic inductance, and the output load circuit is (i) an open circuit impedance at an even harmonic of the input signal, and (ii) a short circuit impedance at an odd harmonic of the input signal.

* * * * *